United States Patent [19]

Whetsel, Jr.

[11] Patent Number: 4,857,835

[45] Date of Patent: Aug. 15, 1989

[54] GLOBAL EVENT QUALIFICATION SYSTEM

[75] Inventor: Lee D. Whetsel, Jr., Plano, Tex.

[73] Assignee: Texas Instruments Incorporated, Dallas, Tex.

[21] Appl. No.: 117,114

[22] Filed: Nov. 5, 1987

[51] Int. Cl.<sup>4</sup> ............................................. G01R 31/00
[52] U.S. Cl. .................................... 324/73 R; 371/15
[58] Field of Search ......................... 324/73 R, 158 R; 371/15, 25

[56] References Cited

U.S. PATENT DOCUMENTS

| | | | |
|---|---|---|---|
| 4,023,142 | 5/1977 | Woessner | 371/15 |
| 4,513,418 | 4/1985 | Bardell et al. | 371/15 |

Primary Examiner—Reinhard J. Eisenzopf
Assistant Examiner—Edward Urban
Attorney, Agent, or Firm—Thomas R. FitzGerald; Leo N. Heiting; Melvin Sharp

[57] ABSTRACT

Test logic may be included in the design of an integrated circuit (IC) to facilitate testability. In most instances, an IC's test logic can only be activated while the IC, or logic sections within the IC, are placed in a non-functional test mode. The present invention is directed toward an event qualification structure providing the timing and control required to activate an IC's test logic during normal functional operation.

11 Claims, 2 Drawing Sheets

GLOBAL EVENT QUALIFICATION SYSTEM

BACKGROUND AND SUMMARY

As semiconductor technologies continue to increase the speed at which ICs operate, at-speed (i.e. at full operational speed) testing at both the IC and circuit board level becomes more difficult. Traditionally, boards are tested at-speed using functional test equipment. The cost of purchasing high speed functionality testers capable of keeping up with state of the art board designs, is rapidly escalating. A new approach is needed to allow more of the IC and board testing to be performed inside the ICs themselves, rather than using external test hooks and expensive test equipment.

The invention provides a novel approach in performing atspeed concurrent testing at the IC or circuit board level. The ability to apply tests during normal operation, allows failures that may occur due to the interaction of ICs on a circuit board assembly, to be detected. These types of failures are very difficult to detect using off-line test techniques since the circuit behavior is modified. When performing off-line testing, a circuit is reconfigured from a functional mode to a test mode. In the test mode the circuit may exhibit a different behavioral characteristic. Thus timing sensitive failures, as well as other subtle failures, are shielded from detection.

To implement at-speed concurrent testing, a means of system level qualification is necessary. The present invention provides a Global Event Qualification Structure (GEQS) that can be implemented into IC designs to provide the timing and control features requird to activate the test logic in one or more ICs on a circuit board assembly. The basis of this structure is achieved by bordering an IC's inputs and outputs with unique comparator cells, referred to as Event Qualifier CELLS (EQCELLs).

The EQCELLs compare the data entering and/or leaving an IC to a set of predetermined compare vectors that are loaded into each EQCELL. Each EQCELL may contain a plurality of scan cells that are loaded during a scan operation. In turn, an EQCELL generates a control signal when a comparison is true.

It is an object of the present invention to provide a mechanism for determining when a selected input and/or output has occurred without interfering with normal operations.

In most instances, it is desirable to know when a given set of inputs and/or outputs has occurred on a particular IC. Therefore an IC may have a plurality of EQCELLs, wherein each input and/or output may have an EQCELL associated with it. The EQCELLs can then be preset to compare for a combination of ones and zeros. All EQCELLs' outputs are then combined to yield a composite output designated the local product term (or EQOUT).

It is an object of the present invention to provide a means for loading a data pattern into a selected set of EQCELLs.

It is also an object of the present invention to generate a local product term indicative of a match between incoming and/or outgoing data of the IC and a preselected pattern.

To test on a larger scale than just one IC, it is desirable to be able to know when a set of input and/or outputs has occurred on more than one IC. Therefore, external logic can be used to combine multiple local product terms into a global product term.

It is an object of the present invention to test for a given pattern of inputs and/outputs on multiple logic circuits without interference of normal operations.

It is also an object of the invention to generate a global product term indicative of multiple product terms showing a match of input and/or output with a preselected pattern.

While knowing when a single even has occurred is all that is require for some forms of testing, there are other types where it is also necessary to know when a second event (i.e. a stop test pattern) has occurred. Therefore the present invention may allow two bits (a START and a STOP) to be input into each EQCELL. The advantage in allowing two comparisons to be stored is speed. Since the invention provides for testing to be performed concurrently with normal operation of the circuit, having the two patterns pre-loaded eliminates the risk of having the second event occur before reloading the EQCELLs.

It is an object of the invention to allow testing to be performed concurrently with normal operation of a logic circuit.

It is also an object of the invention to provide for a start pattern and a stop pattern to be pre-loaded into the EQCELLs.

For some tests, the status of certain inputs and/or outputs is irrelevant or may lead to a delay in detecting the desired I/O condition. The present invention thus can allow an additional bit (referred to as a MASK) to be set in the EQCELL. This in turn will force the EQCELL to always generate a true comparison condition.

It is an object of the invention to allow preselected I/O conditions to be ignored while continuing to check for other conditions.

The invention also provides for local controllers contained within an IC or at a more global level. When a start test condition is met, then the local controller can activate test logic. When a stop pattern is received, then the local controller can terminate the test, signal other circuitry to perform additional functions, and/or cause a reset among other things. The advantages to having local controllers include; minimizing bus wiring, reducing timing delays by having fewer gates and shorter path lengths, and allowing concurrent testing among various logic areas in the system.

It is an object of the present invention to include provisions for local test controllers.

It is also an object of the present invention to allow local test functions to be managed by local test controllers.

These and other objects are achieved by:

A test system comprising:

a logic circuit having input and output adapted for signal data;

selected ones of said logic circuit's input and output having a test cell coupled thereto;

each said test cell having at least one storage for storing a condition;

each said test cell also having a comparator for comparing said signal data with said stored condition; and said comparator generating a control signal indicating a true comparison between said signal data and said stored condition, wherein said control signal is used to effectuate testing of said logic circuit.

BRIEF DESCRIPTIONS OF THE DRAWINGS

DETAILED DESCRIPTION OF THE INVENTION

The present invention allows testing of a logic circuit to be performed whilst the logic circuit is in a functional mode as well as in a test mode. This is done by using loadable comparator circuits on the input and/or outputs of the logic circuit. In the presently preferred embodiment of the invention, both the logic circuit to be tested and the comparison circuitry are located within a single integrated circuit (IC). However the invention can also be employed by using one or more ICs or other discrete components for the comparison circuitry. Similarly the circuit to be tested may consist of one or more ICs or other discrete components.

Figure 1:
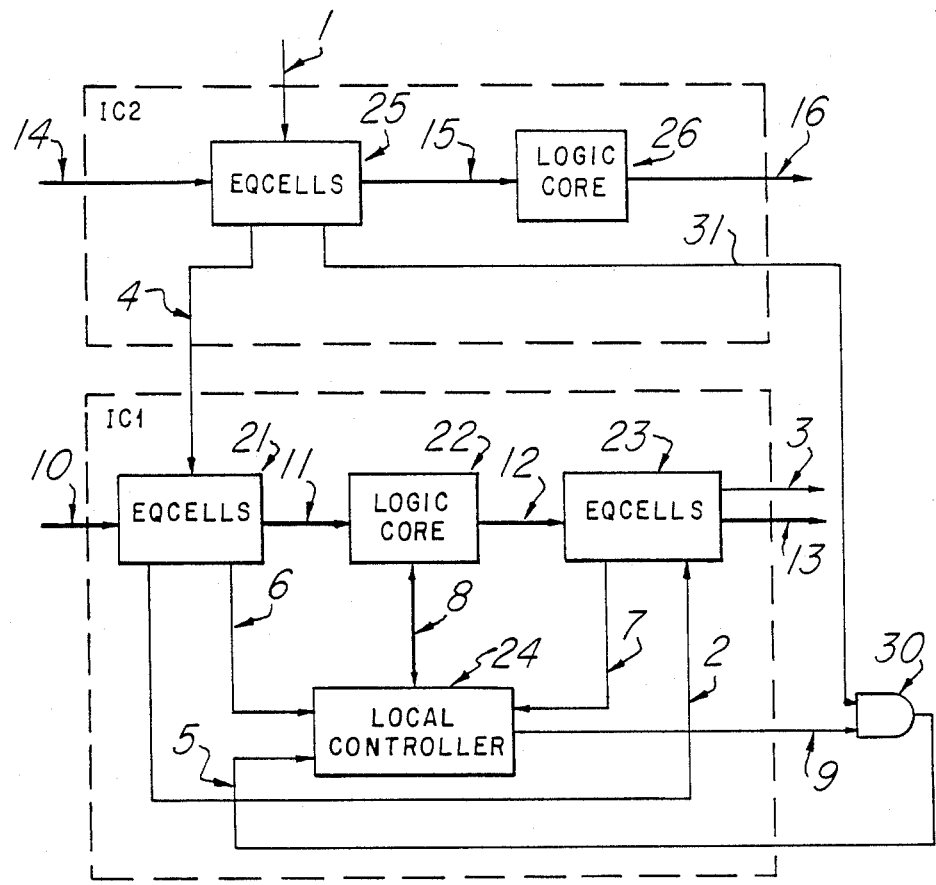
FIG. 1 is a block diagram of a system with two ICs employing the invention.

FIG. 1 illustrates a presently preferred use of the invention with two integrated circuits, IC1 and IC2. Each IC contains a logic core (22 and 26, respectively) that is to be tested. The invention adds a block of EQ-CELLs around the logic cores. This is illustrated with the EQCELL blocks 21, 23 and 25. In addition, IC1 has a local controller 24. The function of each of these, and how they interrelate, will now be explained.

The EQCELL blocks 21, 23 and 25, may each contain a plurality of EQCELLs. Alternatively, the blocks may represent only a single EQCELL. The purpose of the EQCELLs is to compare data that would normally be routed into the logic cores, with data that has been loaded into the EQCELLs. Upon a true comparison, the EQCELLs output a signal indicating that the data being routed into or out of the logic core is equal to the data which the EQCELL was asked to check.

In IC2 of FIG. 1, data to be input into the logic core comes in on bus 14. This data is checked by the EQ-CELL block 25. The data is also allowed to pass through to bus 15, and then into the logic core 26. The output from the logic core 26 goes out bus 16.

The signal indicating a true comparison is output on bus 31. As each EQCELL checks only a single input, then bus 31 may consist of a plurality of signals. Alternatively, these true output signals may be internally ANDed within EQCELL block 25 and so only generate a single signal on bus 31. The tradeoff encountered between ANDing in block 25 and sending all of the signals along bus 31 is speed versus pin count. The addition of the the local AND gate in block 25 introduces delays. However, by ANDing locally, only a single output pin is used. In the presently prefered embodiment, these signals are ANDed prior to exiting the IC. An additional advantage for this is that the output 31 will signal that all the EQCELLs within the IC are indicating that a desired pattern has been detected. This is referred to as a local product term.

In IC1 of FIG. 1, the logic core 22 is surrounded by EQCELL blocks 21 and 23. Data comes into IC1 via bus 10, is checked by EQCELL block 21, and is then sent to logic core 22 on bus 11. Data from logic core 22 is output on bus 12, checked by EQCELL block 23, and output on bus 13. The TRUE comparison signals from EQCELL blocks 21 and 23 are output on buses 6 and 7, respectively. In the presently preferred embodiment, the ANDing of the true signals occur within the local controller 24. This is done to minimize the gate delays. The local product termin from IC1 is generated within the local controller 24, and is output on line 9.

The local controller 24 is also used to control built-in test logic in logic core 22. The control lines necessary for this are indicated by bus 8. The functionality and exact mechanisms of the test logic are well known in the art. What is novel, however, is the ability to test and/or terminate a test in resposne to a condition.

In FIG. 1, the local product terms 9 and 31 are ANDed by AND gate 30. This generates a global product term on bus 5. In the illustration of FIG. 1, the global product term only consists of the two local proudct terms shown. However it should be understood that the global product term may be at a board level or even at a system level. There may also be hierarchical schema of product terms without departing from the scope of the invention.

The global product term on bus 5 is fed back into the local controller 24. This allows the local controller to react to the occurrence of a global event. In the preferred embodiment of the invention, the local controller 24 will start the test of logic core 22 whe bus 5 changes state.

In the preferred embodiment of the invention, each EQCELL is loaded with data for comparison via a serial scan technique. This is illustratd by scan data entering EQCELL block 25 by way of bus 1, continuiong on to EQCELL block 21 on bus 4, over on bus 2 to EQCELL block 23, and finally on to other ICs on bus 3. In other embodiments, the local controler 24 may also be in the serial scan path so as to facilitate different tests.

Figure 2:
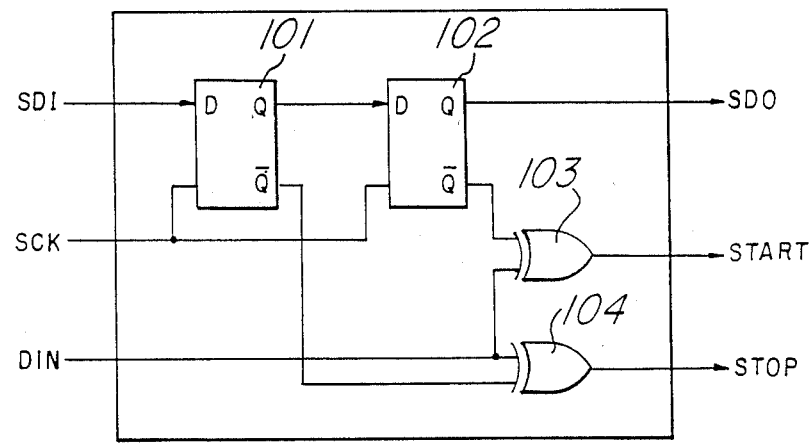
FIG. 2 is a simplified schematic of an EQCELL with START and STOP bit checking.

One preferred embodiment of a single EQCELL is shown in FIG. 2. The two scannable D-type flip-flops 101 and 102 are used to store the STOP and START compare bits respectively. The scan interface for loading the STOP and START compare bits consists of Serial Data In (SDI), Serial Data Out (SDO), and Scan Clock (SCK). This scan interface functions as a shift register that is clocked by the Scan Clock (SCK). Thus scan data coming in on SDI is loaded into the flip-flop 101 via the D input of 101 when SCK goes high. Data previously latched into the flip-flop 101 is simultaneously output on Q of 01 and is received as the input to flip-flo 102 by its respective D input. Similarly, flip-flop 102 outputs its previously stored data on the Q output which ones to the SDO bus. Cascading EQCELLs is accomplished by connecting the SDO of the preceding EQCELL, to the SDI of the next EQCELL in the ring.

The inverted Q output of flip-flop 101 connects to one input of Exclusive OR gate 104 and the inverted Q outputs of the flip-flop 102 connects to one input of Exclusive OR gate 103. The other input of Exclusive OR gates 103 and 104 is attached to the signal to be compared (DIN). The inverted Q outputs caused to the Exclusive OR gates 103 and 104 to output a high if the input signal matches the Q output s of flip-flops 102 and 101, respectively.

As can be seen, the EQCELL of FIG. 1 allows two bits to be compared with separate output s START and STOP. When multiple EQCELLs ar used, and their START outputs ANDed together, then the resulting product term can be used to notify test logic of an occurrence of an event. The test logic in turn may take a "snapshot" of the state of the system using a boundary scan or other test means. Alternatively, other test logic may dynamically be activated on a local or global basis. This is the technique employed in FIG. 1 with the local controller 24.

Likewise, the STOP outputs can be ANDed together to indicate that a condition has occurred which is used to terminate a test sequence. The advantage to having two bits stored, and the ability to check for each without reloading the EQCELL is that the events sought to be qualified may occur in a relatively short time. Since the preferred embodiment loads the EQCELLs with a clocked serial scan, the loading period is likely to be longer than the period between the start and stop events.

Figure 3:
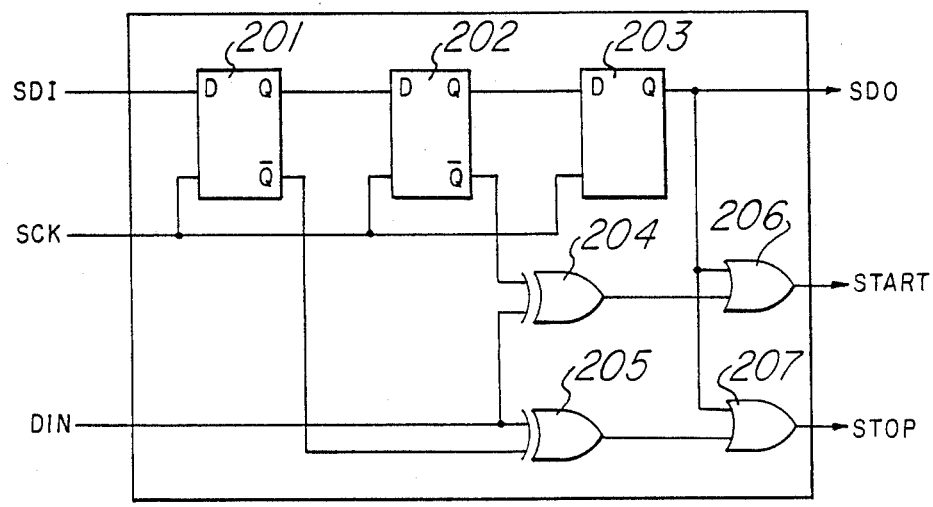
FIG. 3 is a simplified schematic of a maskable EQ-CELL.

In many instances, it is neither necessary nor desirable to have every I/O line meet a specified condition in order to start or terinate a test. Therefore the present invention provides a mechanism for masking off a given EQCEll such it outputs a match (to true) condition regardless of the actual data input. One preferred embodiment is illustrated in FIG. 3. The two scannable D-type flip-flops 201 and 202 are used to store the STOP and START compare bits respectively. Flip-flop 203 is used to store a MASK bit. If the MASK bit is set to a 1, then the outputs START and STOP will always output a true condition. If the MASK bit is a zero, then the EQCELL START and STOP outputs will function identically to the EQCELL shownin FIG. 2.

The scan interface for the EQCELL in FIG. 3 functions in a like manner to the scan interface in FIG. 2, except that there is an additional bit position represented by flip-flop 203 that is to be loaded. That is to say that serial data comes in on the SDI bus into the D input for flip-flop 201, the previously loaded data in 201 is output by the Q output of 201. The D input of flip-flop 202 is connected to the Q output of 201 and the Q output of 202 is connected to the D input of flip-flop 203. In turn, the Q output of 203 continues out on bus SDO. All of the data transfer is of course controlled by the clock signal SCK.

Exclusive OR gate 205 has one input connected to the inverted Q output of flip-flop 201. The inverted Q output of flip-flop 202 is connected to one input of Exclusive OR gate 204. The other inputs of the Exclusive OR gates 204 and 205 are connected to the compare data input DIN. Consequently, when there is a match between the incoming data DIN and the data stored in flip-flo 202, then a high will be output from Exclusive OR gate 204 The same holds true for Exclusive OR gae 205 except the match must be between DIN and data in flip-flop 201.

The masking operation ccours by setting the MASK bit to a one. When this occurs, then the Q output of 203 will be a one. As this feeds into OR gates 206 and 207, then the START and STOP outputs will always be one. If the MASK bit is a zero, then outputs START and STOP are equivalent to the outputs of Exclusive OR gates 204 and 205 respectively.

Thus the EQCELLS provide a mechanism for qualifying an event occurring on a single line, selected I/O lines of an IC, selected I/O lines of a board or even of an entire system. Further the invention allows this qualification to occur during normal functioning for a circuit as well as in dedicated test situations. Therefore opening up the ability to test for certain tpes of failures that heretofore have been difficult or impossible to detect.

While certain presently preferred embodiments of the invention have been discussed, these are intended merely as illustrative. Other embodiments of the invention are possible without departing from the scope of the invention. All limitations are set out in the claims below.

What is claimed is:

1. A test system comprising:
   a logic circuit having input and output adapted for signal data;
   selected ones of said logic circuit's input and output having a test cell coupled thereto;
   each said test cell having plural storages each for storing a condition;
   each said test cell also having plural comparators each for comparing said signal data with said respective stored conditions; and
   said comparators each generating a control signal indicating a true comparison between said signal data nd said respective stored condition, wherein said control signals are used to effectuate testing of said logic circuit.

2. The test system as claimed in claim 1 wherein said comparator operates simultaneously with the normal operation of said logic circuit.

3. The test system as claimed in claim 1 wherein said testing of said logic circuit is performed simultaneously with the normal operation of the logic circuit.

4. An event qualifier system comprising:
   a logic circuit having input and output adapted for signal data;
   selected ones of said logic circuit's input and output having a test cell coupled thereto;
   each said test cell having at least one storage for storing a condition;
   each said test cell also having a comparator for comparing said signal data with said stored condition;
   each said comparator generating control signals indicating a true comparison between said signal data and said stored condition; and,
   a combining circuit for combining said control signals and generating a second control signal, wherein said second control signal is used to indicate that a pre-selected pattern of inputs and outputs has occurred.

5. An event qualifier system as claimed in claim 4 wherein said comparator selectiely operates simultaneously with the normal operation of said logic circuit.

6. An event qualifier system as claimed in claim 4 wherein selected ones of said test cells are masked so as to cause said selected ones of test cell's said compararor to output a true comparison.

7. A global event qualifier system comprising:
   a plurality of logic circuits;
   each said logic circuit comprising a logic core having selected inputs and outputs with test cells coupled thereto, said test cells comparing said inputs and outputs with a pre-selected data stored within said test cells and outputting a first control signal indicative of a match; and,
   a combining circuit for combining selected ones of said first control signals and generating a second control signal indicative of the occurrence of a pre-determined state of said selected inputs and outputs.

8. The global event qualifier system as claimed in claim 7 wherein selected ones of said logic circuits comprise integrated circuits.

9. The global event qualifier system as claimed in claim 7 wherein selectd said test cells are coupled via a serial scan interface for loading said pre-selected data.

10. The global event qualifier system as claimed in claim 7 wherein selected ones of said test cells are masked so that the respective said first control signal will indicate a match.

11. A test system comprising:
 a plurality of logic circuits;
 each said logic circuit comprising a logic core having selected inputs and outputs with test cells coupled thereto, said test cells comparing said inputs and outputs with pre-selected data stored within said test cells and outputting a first control signal indicative of a match;
 a combining circuit for combining selected ones of said first control signals and generating a second control signal; and, selected ones of said logic circuits having test circuitry responsive to said second control signal.

* * * * *